US012763162B2

(12) United States Patent
Ahn et al.

(10) Patent No.: US 12,763,162 B2
(45) Date of Patent: Oct. 13, 2026

(54) MEMORY DEVICE AND TEST METHOD FOR THE MEMORY DEVICE

(71) Applicant: Samsung Electronics Co., Ltd., Suwon-si (KR)

(72) Inventors: Byoungjin Ahn, Suwon-si (KR); Dongseok Kang, Suwon-si (KR); Shinho Kim, Suwon-si (KR); Jongwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 18/888,271

(22) Filed: Sep. 18, 2024

(65) Prior Publication Data

US 2025/0239321 A1 Jul. 24, 2025

(30) Foreign Application Priority Data

Jan. 24, 2024 (KR) ........................ 10-2024-0011162

(51) Int. Cl.
*G11C 29/44* (2006.01)

(52) U.S. Cl.
CPC .................................... *G11C 29/44* (2013.01)

(58) Field of Classification Search
CPC . G11C 29/44; G11C 29/26; G11C 2029/2602; G11C 29/12; G11C 29/34; G11C 2029/1202; G11C 2029/1204
See application file for complete search history.

(56) References Cited

U.S. PATENT DOCUMENTS

| | | | | |
|---|---|---|---|---|
| 7,634,709 | B2 | 12/2009 | Bauman et al. | |
| 9,805,827 | B2 | 10/2017 | Son et al. | |
| 2004/0184327 | A1 | 9/2004 | Okuda | |
| 2022/0012125 | A1* | 1/2022 | Li | G06F 11/0787 |
| 2022/0113889 | A1* | 4/2022 | Park | G11C 29/022 |
| 2022/0122682 | A1* | 4/2022 | Sharma | G11C 29/10 |
| 2022/0139485 | A1 | 5/2022 | Kim et al. | |
| 2022/0374306 | A1 | 11/2022 | McLaren et al. | |

FOREIGN PATENT DOCUMENTS

| | | | |
|---|---|---|---|
| EP | 3341844 | A1 | 7/2018 |
| KR | 10-2004-0070061 | A | 8/2004 |
| KR | 10-2238706 | B1 | 4/2021 |
| KR | 10-2022-0060378 | A | 5/2022 |
| KR | 10-2493803 | B1 | 2/2023 |

* cited by examiner

*Primary Examiner* — Thien Nguyen
(74) *Attorney, Agent, or Firm* — Muir Patent Law, PLLC

(57) ABSTRACT

A memory device comprising a memory core including a memory cell array including a plurality of memory cells, the memory cell array being divided into a plurality of memory banks, a Built-In Self Test (BIST) circuit configured to select a target memory bank from the plurality of memory banks and perform a parallel test on the target memory bank, and a control circuit configured to control the parallel test. The BIST circuit may determine at least one defective memory cell outputting a defective bit among target memory cells included in the target memory bank, and may determine whether the defective memory cell is a single defective memory cell or an adjacent double defective memory cell, and the control circuit May determine the target memory bank to be a defective memory bank when the defective memory cell is not the single defective memory cell and the adjacent double defective memory cell.

20 Claims, 13 Drawing Sheets

| | | CASE1 | CASE2 | CASE3 | CASE4 | CASE5 | CASE6 |
|---|---|---|---|---|---|---|---|
| FIRST PAIR | A0 | 1 | 1 | 1 | 1 | 1 | 0 |
| | A1 | 1 | 1 | 1 | 1 | 1 | 0 |
| SECOND PAIR | A2 | 1 | 1 | 1 | 0 | 0 | 0 |
| | A3 | 1 | 1 | 1 | 0 | 0 | 0 |
| THIRD PAIR | A4 | 1 | 1 | 0 | 1 | 0 | 0 |
| | A5 | 1 | 1 | 0 | 1 | 0 | 0 |
| FOURTH PAIR | A6 | 1 | 0 | 0 | 0 | 0 | 0 |
| | A7 | 1 | 0 | 0 | 0 | 0 | 0 |
| IS1 | | L | H | L | L | H | L |
| IS2 | | L | L | L | H | H | H |
| IS3 | | H | H | H | H | H | H |
| OUT3 | | L | L | L | L | H | L |

0: NORMAL BIT OUTPUT
1: DEFECTIVE BIT OUTPUT

FIG. 6

| | | CASE1 | CASE2 | CASE3 | CASE4 | CASE5 | CASE6 |
|---|---|---|---|---|---|---|---|
| FIRST PAIR | A1 | 1 | 1 | 1 | 1 | 1 | 0 |
| | A2 | 1 | 1 | 1 | 1 | 1 | 0 |
| SECOND PAIR | A3 | 1 | 1 | 1 | 0 | 0 | 0 |
| | A4 | 1 | 1 | 1 | 0 | 0 | 0 |
| THIRD PAIR | A5 | 1 | 1 | 0 | 1 | 0 | 0 |
| | A6 | 1 | 1 | 0 | 1 | 0 | 0 |
| FOURTH PAIR | A7 | 1 | 0 | 0 | 0 | 0 | 0 |
| | A0 | 1 | 0 | 0 | 0 | 0 | 0 |
| IS1 | | L | H | L | L | H | L |
| IS2 | | L | L | L | H | H | H |
| IS3 | | H | H | H | H | H | H |
| OUT3 | | L | L | L | L | H | L |

0: NORMAL BIT OUTPUT
1: DEFECTIVE BIT OUTPUT

FIG. 7

| | WL0 | WL1 | WL2 | WL3 | WL4 | WL5 | WL6 | WL7 |
|---|---|---|---|---|---|---|---|---|
| BL0 | 0 | 0 | 0 | 0 | 0 | 0 | 0 | 0 |
| BL1 | 0 | 0 | 0 | 0 | 0 | 0 | 0 | 0 |
| BL2 | 0 | 0 | 0 | 0 | 0 | 0 | 0 | 0 |
| BL3 | 0 | 0 | 0 | 0 | 0 | 0 | 0 | 0 |
| BL4 | 0 | 0 | 0 | 0 | 0 | 0 | 0 | 0 |
| BL5 | 0 | 0 | 0 | 0 | 0 | 0 | 0 | 0 |
| BL6 | 0 | 0 | 0 | 0 | 0 | 0 | 0 | 0 |
| BL7 | 0 | 0 | 0 | 0 | 0 | 0 | 0 | 0 |

0: NORMAL BIT OUTPUT
1: DEFECTIVE BIT OUTPUT

FIG. 8A

| | | | | | | | | |
|---|---|---|---|---|---|---|---|---|
| OUT1 | H | H | H | H | H | H | H | H |
| OUT2 | – | – | – | – | – | – | – | – |
| OUT3 | – | – | – | – | – | – | – | – |

FIG. 8B

| | WL0 | WL1 | WL2 | WL3 | WL4 | WL5 | WL6 | WL7 |
|---|---|---|---|---|---|---|---|---|
| BL0 | 1 | 0 | 0 | 0 | 0 | 0 | 0 | 0 |
| BL1 | 0 | 0 | 0 | 0 | 0 | 0 | 0 | 0 |
| BL2 | 0 | 0 | 0 | 0 | 0 | 0 | 0 | 0 |
| BL3 | 0 | 0 | 0 | 0 | 0 | 0 | 0 | 0 |
| BL4 | 0 | 0 | 0 | 0 | 0 | 0 | 0 | 0 |
| BL5 | 0 | 0 | 0 | 0 | 0 | 0 | 0 | 0 |
| BL6 | 0 | 0 | 0 | 0 | 0 | 0 | 0 | 0 |
| BL7 | 0 | 0 | 0 | 0 | 0 | 0 | 0 | 0 |

0: NORMAL BIT OUTPUT
1: DEFECTIVE BIT OUTPUT

FIG. 9A

| | | | | | | | | |
|---|---|---|---|---|---|---|---|---|
| OUT1 | L | H | H | H | H | H | H | H |
| OUT2 | H | L | L | L | L | L | L | L |
| OUT3 | L | L | L | L | L | L | L | L |

FIG. 9B

| | WL0 | WL1 | WL2 | WL3 | WL4 | WL5 | WL6 | WL7 |
|---|---|---|---|---|---|---|---|---|
| BL0 | 0 | 0 | 1 | 0 | 0 | 0 | 0 | 0 |
| BL1 | 0 | 0 | 1 | 0 | 0 | 0 | 0 | 0 |
| BL2 | 0 | 0 | 0 | 0 | 0 | 0 | 0 | 0 |
| BL3 | 0 | 0 | 0 | 0 | 0 | 0 | 0 | 0 |
| BL4 | 0 | 0 | 0 | 0 | 0 | 0 | 0 | 0 |
| BL5 | 0 | 0 | 0 | 0 | 0 | 0 | 0 | 0 |
| BL6 | 0 | 0 | 0 | 0 | 0 | 0 | 0 | 0 |
| BL7 | 0 | 0 | 0 | 0 | 0 | 0 | 0 | 0 |

0: NORMAL BIT OUTPUT
1: DEFECTIVE BIT OUTPUT

FIG. 10A

| | | | | | | | | |
|---|---|---|---|---|---|---|---|---|
| OUT1 | H | H | L | H | H | H | H | H |
| OUT2 | L | L | L | L | L | L | L | L |
| OUT3 | L | L | H | L | L | L | L | L |

FIG. 10B

| | WL0 | WL1 | WL2 | WL3 | WL4 | WL5 | WL6 | WL7 |
|---|---|---|---|---|---|---|---|---|
| BL0 | 0 | 0 | 0 | 0 | 0 | 0 | 0 | 0 |
| BL1 | 0 | 0 | 1 | 0 | 0 | 0 | 0 | 0 |
| BL2 | 0 | 0 | 1 | 0 | 0 | 0 | 0 | 0 |
| BL3 | 0 | 0 | 0 | 0 | 0 | 0 | 0 | 0 |
| BL4 | 0 | 0 | 0 | 0 | 0 | 0 | 0 | 0 |
| BL5 | 0 | 0 | 0 | 0 | 0 | 0 | 0 | 0 |
| BL6 | 0 | 0 | 0 | 0 | 0 | 0 | 0 | 0 |
| BL7 | 0 | 0 | 0 | 0 | 0 | 0 | 0 | 0 |

0: NORMAL BIT OUTPUT
1: DEFECTIVE BIT OUTPUT

FIG. 11A

| | | | | | | | | |
|---|---|---|---|---|---|---|---|---|
| OUT1 | H | H | L | H | H | H | H | H |
| OUT2 | L | L | L | L | L | L | L | L |
| OUT3 | L | L | L | L | L | L | L | L |

FIG. 11B

| | WL0 | WL1 | WL2 | WL3 | WL4 | WL5 | WL6 | WL7 |
|---|---|---|---|---|---|---|---|---|
| BL0 | 0 | 0 | 0 | 0 | 0 | 0 | 0 | 0 |
| BL1 | 0 | 1 | 0 | 0 | 0 | 0 | 0 | 0 |
| BL2 | 0 | 0 | 0 | 0 | 0 | 0 | 0 | 0 |
| BL3 | 0 | 0 | 0 | 0 | 1 | 0 | 0 | 0 |
| BL4 | 0 | 0 | 0 | 0 | 1 | 0 | 0 | 0 |
| BL5 | 0 | 0 | 0 | 0 | 0 | 0 | 0 | 0 |
| BL6 | 0 | 0 | 0 | 0 | 0 | 0 | 0 | 0 |
| BL7 | 0 | 0 | 0 | 0 | 0 | 0 | 0 | 0 |

0: NORMAL BIT OUTPUT
1: DEFECTIVE BIT OUTPUT

FIG. 12A

| | | | | | | | | |
|---|---|---|---|---|---|---|---|---|
| OUT1 | H | L | H | H | L | H | H | H |
| OUT2 | L | L | L | L | L | L | L | L |
| OUT3 | L | L | L | L | L | L | L | L |

FIG. 12B

MEMORY DEVICE AND TEST METHOD FOR THE MEMORY DEVICE

CROSS-REFERENCE TO RELATED APPLICATION(S)

This application claims the benefit of priority under 35 U.S.C. § 119 to Korean Patent Application No. 10-2024-0011162 filed on Jan. 24, 2024, in the Korean Intellectual Property Office, the disclosure of which is incorporated herein by reference in its entirety.

BACKGROUND

The present disclosure relates to a memory device and test method for the memory device.

Semiconductor memory devices are generated through a semiconductor manufacturing process and then tested by test equipment in a wafer, die, or package state. Through testing, defective memory devices may be identified, and when some memory cells are defective, a repair operation may be performed to repair the memory device. With micro-processing, the possibility of an occurrence of errors in a manufacturing process of memory devices such as dynamic random access memory (DRAM) is increasing. The errors in the manufacturing process may produce defective memory devices. Additionally, errors may occur during operation of a defective memory device. An initial testing stage prior to operation of the defective memory device may not identify the defective memory device. Accordingly, the importance of Built-In Self Test (BIST) of memory devices is increasing.

SUMMARY

An aspect of the present disclosure is to provide a memory device for determining a memory bank to be defective and a test method for the memory device when a single memory cell is defective or a pair of adjacent memory cells are not both defective, in a memory bank including defective memory cells.

According to an aspect of the present disclosure, a memory device may include: a memory core including a memory cell array including a plurality of memory cells, the memory cell array being divided into a plurality of memory banks; a Built-In Self Test (BIST) circuit for selecting a target memory bank from the plurality of memory banks and performing a parallel test on the target memory bank; and a control circuit for controlling the parallel test, wherein the BIST circuit may determine at least one defective memory cell outputting a defective bit among target memory cells included in the target memory bank, and may determine whether the defective memory cell is a single defective memory cell or an adjacent double defective memory cell, and the control circuit may determine the target memory bank to be a defective memory bank when the defective memory cell is not the single defective memory cell and the adjacent double defective memory cell.

According to an aspect of the present disclosure, a memory device may include: a memory core including a memory cell array including a plurality of memory cells, the memory cell array being divided into a plurality of memory banks; a BIST circuit for selecting a target memory bank from the plurality of memory banks and performing a parallel test on the target memory bank; and a control circuit for controlling the parallel test, wherein the BIST circuit may include, for target memory cells included in the target memory bank, a first test circuit for determining a defective memory cell and outputting a first output signal, a second test circuit for determining whether the defective memory cell is a single defective memory cell and outputting a second output signal, and a third test circuit for determining whether the defective memory cell is an adjacent double defective memory cell and outputting a third output signal, and the control circuit may determine the target memory bank to be a defective memory bank when the defective memory cell is not the single defective memory cell and the adjacent double defective memory cell using the first output signal to the third output signal.

According to an aspect of the present disclosure, a test method for a memory device including a plurality of memory banks may include: selecting a target memory bank from the plurality of memory banks, and determining a defective memory cell outputting a logic state different from an input bit among target memory cells included in the target memory bank; when the defective memory cell is determined among the target memory cells, determining whether the defective memory cell is a single defective memory cell or an adjacent double defective memory cell; and when the defective memory cell is not the single defective memory cell and the adjacent double defective memory cell, determining the target memory bank to be a defective memory bank.

According to an example embodiment of the present disclosure, in a memory bank in which a defective memory cell is determined among a plurality of memory cells included in a memory block, it may be determined whether a single memory cell is defective or whether a pair of adjacent memory cells are both defective. When the defective memory cell is a single memory cell or a pair of adjacent memory cells, the memory bank may be determined to be normal and a repair operation may not be performed on the memory bank. Accordingly, the consumption of memory cells to be replaced by the repair operation may be reduced to improve a yield of a memory device.

Advantages and effects of the present application are not limited to the foregoing content and may be more easily understood in the process of describing a specific example embodiment of the present disclosure.

BRIEF DESCRIPTION OF DRAWINGS

The above and other aspects, features, and advantages of the present disclosure will be more clearly understood from the following detailed description, taken in conjunction with the accompanying drawings, in which:

FIGS. 6 and 7 are views illustrating signals of a third test circuit according to example embodiments of the present disclosure;

FIGS. 8A, 8B, 9A, 9B, 10A, 10B, 11A, 11B, 12A, and 12B are diagrams illustrating output signals according to performing a target memory bank and a parallel test according to example embodiments of the present disclosure.

DETAILED DESCRIPTION

Hereinafter, example embodiments of the present disclosure will be described with reference to the accompanying drawings.

Figure 1:
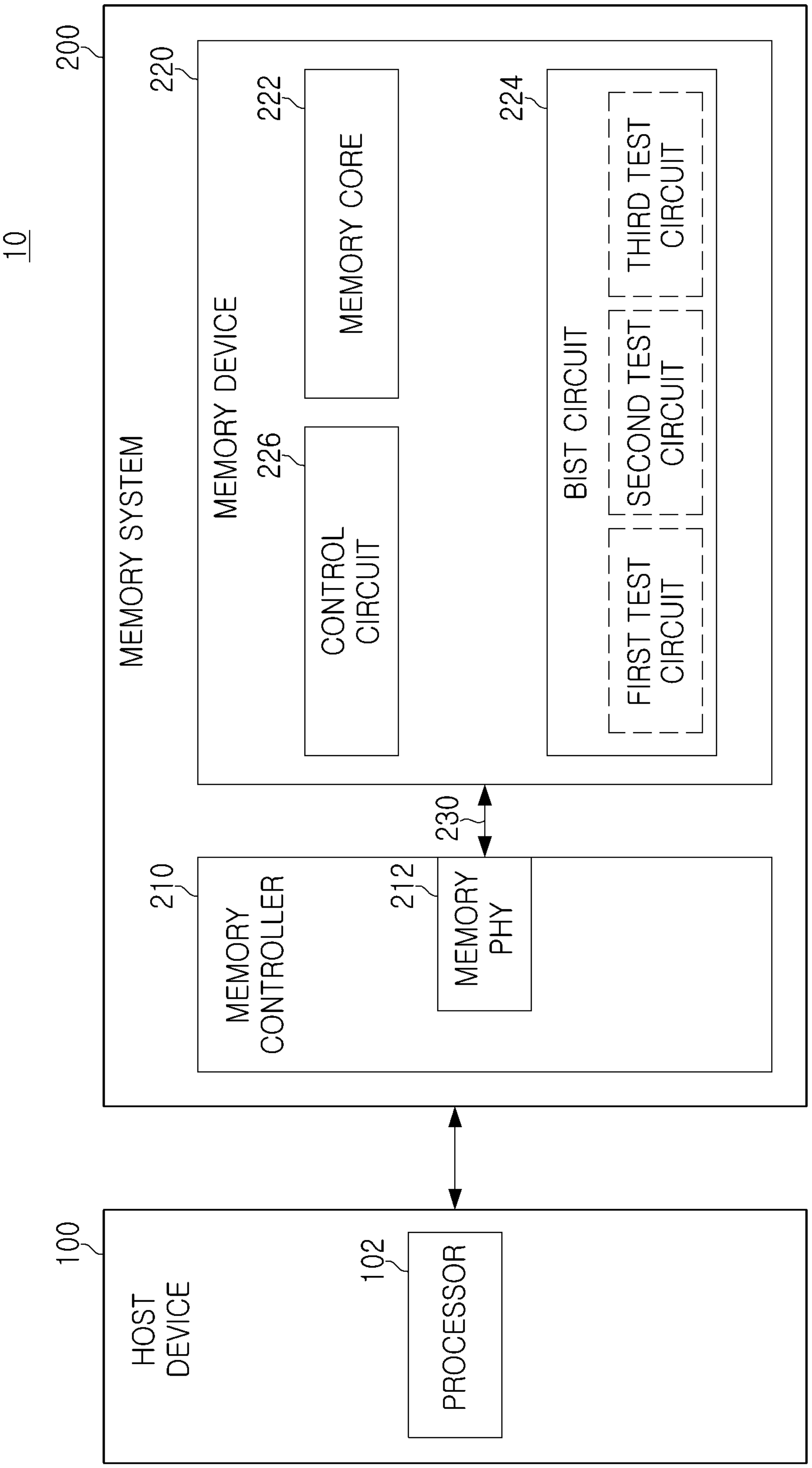
FIG. 1 is a view schematically illustrating a host-memory system according to an example embodiment of the present disclosure.

FIG. 1 is a view schematically illustrating a host-memory system according to an example embodiment of the present disclosure.

Referring to FIG. 1, a host-memory system 10 may be a data center comprised of dozens of host devices or servers. According to some example embodiments, the host-memory system 10 may be, for example, a laptop computer, a desktop computer, a server computer, a work station, a portable communication terminal, a personal digital assistant (PDA), a portable multimedia player (PMP), a smartphone, a tablet PC, and a computing device such as any other suitable computer, a virtual machine, or a virtual computing device thereof. Alternatively, the host-memory system 10 may be some of the components included in a computing system, such as a graphics card.

The host-memory system 10 is illustrated with a number of hardware configurations that will be described in more detail below with reference to FIG. 1, but the present disclosure is not limited thereto. The host-memory system 10 may include a host device 100 and a memory system 200. The host device 100 and the memory system 200 may be connected according to various standard interfaces.

The host device 100 may include a processor 102 and may execute an operating system (OS) and/or various applications. The processor 102 may be communicatively connected to the memory system 200. The memory system 200 connected to the processor 102 may be referred to as a system memory.

The processor 102 is a functional block for performing general computer operations in the host-memory system 10, and may be a central processing unit (CPU), a digital signal processor (DSP), and a network processor, an application processor (AP) or any type of processor like another device for executing a code. The processor 102 may be configured to execute one or more machine-executable instructions or pieces of software, firmware, or combinations thereof. The processor 102 may include any number of processor cores. For example, the processor 102 may include a single-core, or may include a multi-core such as a dual-core, a quad-core, or a hexa-core. Although FIG. 1 illustrates a host-memory system 10 including one processor 102, but according to an example embodiment, the host-memory system 10 may include a plurality of processors.

The memory system 200 may include a memory controller 210, a memory device 220, and a memory interface 230. The memory controller 210 may control a memory access operation (e.g., a write operation or a read operation) for the memory device 220 in response to a request from the host device 100 connected to the memory system 200. The memory device 220 may be used as a working memory for recording or loading data used in an operation of the processor 102. Although FIG. 1 shows a memory system 200 including one memory in device 220, but according to an example embodiment, the memory system 200 may include a plurality of memory devices.

For the sake of brevity, the memory interface 230 is illustrated as being connected through a single signal line between the memory controller 210 and the memory device 220, and may be connected via a plurality of signal lines. The memory interface 230 may include connectors for connecting the memory controller 210 and the memory device 220, and the connectors may be implemented as pins, balls, signal lines, or other hardware components. For example, a clock signal (CLK), a command/address signal (CMD/ADDR), data (DQ), and the like, may be transmitted and received between the memory controller 210 and the memory device 220 through the memory interface 230. The memory interface 230 may be implemented with a single channel including a plurality of signal lines, or may be implemented with a plurality of channels. The memory interface 230 may be referred to as a channel, and in the following example embodiments, the terms 'memory interface 230' and 'channel' may be used interchangeably.

The memory controller 210 may access the memory device 220 in response to a memory request from the processor 102, and a system physical address may be provided for memory access. The memory controller 210 may include a memory physical layer interface, that is, a memory PHY 212, for memory interfacing, such as selecting rows and columns corresponding to memory cells, programming data into memory cells, or reading written data.

The memory PHY 212 may have various forms of actual physical implementation of the memory controller 210, for performing the functions illustrated above. For example, the memory controller 210 may include physical components for exchanging data with the memory device 220, and may include at least one transmitter and at least one receiver. The memory controller 210 may be implemented with one or more hardware components (e.g., analog circuits or logic circuits), software, and/or a firmware program code. The memory controller 210 may be commonly integrated into the processors 102 to ensure consistent access to the memory devices 220 by the processors 102.

The memory device 220 may be a DRAM device. However, the memory device 220 is not limited to a DRAM device, and the memory device 220 may be one of volatile memory devices such as Synchronous DRAM (SDRAM), Double Data Rate SDRAM (DDR SDRAM), Low Power Double Data Rate SDRAM (LPDDR SDRAM), Graphics Double Data Rate SDRAM (GDDR SDRAM), DDR2 SDRAM, DDR3 SDRAM, DDR4 SDRAM, DDR5 SDRAM, Wide I/O DRAM, High Bandwidth Memory (HBM), and Hybrid Memory Cube (HMC). According to another example embodiment, the memory device 220 may be one of a plurality of memory devices mounted on a memory module. The memory modules may be implemented as UDIMM (Unbuffered Dual In-line Memory Module), Registered DIMM (RDIMM), Load Reduced DIMM (LRDIMM), Fully Buffered DIMM (FBDIMM), and Small Outline DIMM (SODIMM).

The memory device 220 may include a memory core 222, a Built-In Self Test (BIST) circuit 224, a control circuit 226 and an error correction circuit (ECC) 228.

The memory core 222 may include a plurality of memory cell arrays. Each of the plurality of memory cell arrays may be divided into a plurality of memory banks. Each of the plurality of memory cells may be a DRAM cell comprised of one access transistor and one storage capacitor.

The control circuit 226 may control access to the memory core 222 based on commands and addresses received by memory device 220. For example, the control circuit 226 may control read, write, and refresh operations of the memory core 222 based on commands and addresses received from the memory controller 210 through the memory interface 230. Additionally, the control circuit 226 may control testing of the memory device 220 by using the BIST circuit 224.

The BIST circuit 224 may perform testing of memory device 220. Specifically, the BIST circuit 224 may test whether a memory bank and/or a memory cell of a memory bank of the memory core 222 is defective. For example, the BIST circuit 224 may perform a test by writing test data to the memory core 222 and reading the written data. The BIST circuit 224 may compare the written data with the test data prior to the writing operation and determine whether a memory cell and/or a memory bank is defective.

According to some embodiment, the BIST circuit 224 may select a target memory bank from a plurality of memory banks and perform a parallel test on the plurality of memory banks to determine whether the target memory bank among the plurality of memory banks is defective. For example, the parallel test may be a test for determining whether the target memory bank among the plurality of memory banks is defective based on whether logic states input to the target memory bank match with logic states input to the plurality of memory banks. More specifically, by recording input bits of the same logical state to the plurality of memory banks and comparing the input bits of the same logical state to corresponding output bits output from the target memory bank, the BIST circuit 224 can determine whether the target memory bank is defective or not. However, the present disclosure is not limited thereto, and input bits having a specific pattern may be recorded in the target memory bank.

Specifically, among the target memory cells included in the target memory bank, when a single memory cell outputs a logic state different from the input bit, or a pair of adjacent memory cells output a logic state different from the input bit, the target memory bank may be determined not to be defective. In other words, in this case, the target memory bank may be determined to be a normal memory bank, and a repair operation may not be performed. In other words, the BIST circuit 224 may not determine that a single bit error and adjacent double bits error occurring in a memory bank as defective because an error correction circuit (ECC) 228 included in the memory device 220 may perform error correction operation on the single bit error (e.g., SEC) and/or the adjacent double bit error (e.g., SE2C). Accordingly, the BIST circuit 224 may not need perform a repair operation on defective memory cells that are correctable by the ECC circuit 228. Here, the term adjacent double bit error may refer to errors occurring in two memory cells adjacent to each other (i.e., adjacent two memory cells) among the plurality of memory cells. The adjacent two memory cells may correspond to double defective memory cell, that is connected to the same word line and a pair of bit lines adjacent to each other. However, because the single bit error and the adjacent double bit error may not necessarily occur due to the strength of the memory cells, thus it may be necessary to test the strength or soundness of the memory cells to determine whether one or more of these memory cells are defective.

When the BIST circuit 224 determines only a case in which a single memory cell outputs a logic state different from the input bit, among the target memory cells included in the target memory bank, the control circuit 226 may determine that a memory bank in which a pair of adjacent memory cells output a logic state different from the input bit is defective. Additionally, an unnecessary repair operation may be performed.

According to an example embodiment of the present disclosure, the BIST circuit 224 may distinguish and determine cases in which a pair of adjacent memory cells output a logic state different from the input bit. In this case, the control circuit 226 may determine the target memory bank to be a normal memory bank. Accordingly, yield may be improved by reducing consumption of repair memory cells to be replaced. For example, a repair memory cell may be a supplemental memory cell that is fabricated in the memory device, and is used to replace a defective memory cell. In other words, the BIST circuit 224 may not need to use a repair memory cell to replace one or memory cells with the single bit error or adjacent double bit errors that are correctable by the ECC circuit 228, thereby saving repair memory cells.

Figure 2:
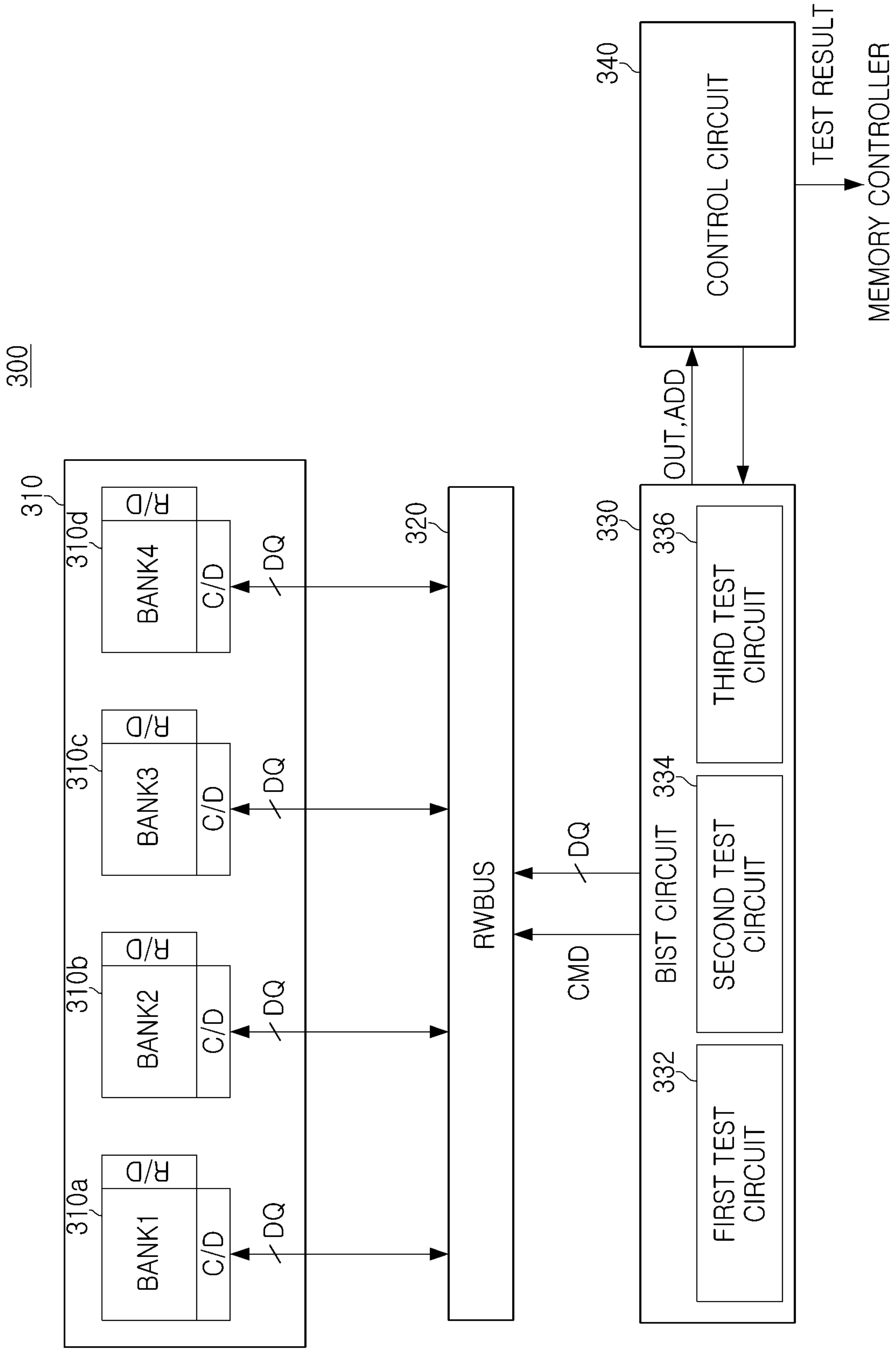
FIG. 2 is a view schematically illustrating a memory device according to an example embodiment of the present disclosure.

FIG. 2 is a view schematically illustrating a memory device according to an example embodiment of the present disclosure.

The memory device 300 of FIG. 2 may correspond to the memory device 220 described with reference to FIG. 1. The memory device 300 may include a memory core 310, a read/write bus 320, a BIST circuit 330, and a control circuit 340.

The memory core 310 may include a plurality of memory banks 310*a* to 310*d*. In other words, the memory core 310 may include a memory cell array, and the memory cell array may be divided into the plurality of memory banks 310*a* to 310*d*.

Each of the plurality of memory banks 310*a* to 310*d* may include a plurality of memory cells, a row decoder (R/D), a column decoder (C/D), and a sense amplifier. Each of the plurality of memory banks 310*a* to 310*d* may include a plurality of word lines and a plurality of bit lines, and the plurality of memory cells may be connected to a plurality of word lines and a plurality of bit lines.

The memory core 310 of an example embodiment illustrated in FIG. 2 may include four memory banks 310*a* to 310*d*, but the number of memory banks may not be limited thereto.

The read/write bus 320 may provide a data path between the plurality of memory banks 310*a* to 310*d* and the memory interface. FIG. 2 illustrates a data line DQ between the read/write bus 320 and the plurality of memory banks 310*a* to 310*d*. The BIST circuit 330 may provide read and write commands (CMD) to test data paths of the plurality of memory banks 310*a* to 310*d*.

According to an example embodiment of the present disclosure, the BIST circuit 330 may select a target memory bank from the plurality of memory banks 310*a* to 310*d* and perform a parallel test on the plurality of memory banks 310*a* to 310*d*. Based on the parallel test, the BIST circuit 330 may determine one or more defective memory cell in the target memory bank that outputs output bits having one or more logic states different from logic states of the input bits, and may determine whether an error is a single bit error and/or an adjacent double bits error.

According to an example embodiment of the present disclosure, the BIST circuit 330 may include a first test circuit 332, a second test circuit 334, and a third test circuit 336.

The first test circuit 332 may determine whether a defective memory cell exists in the target memory bank.

The second test circuit 334 may determine whether the defective memory cell is a single defective memory cell.

Among the target memory cells, when the single memory cell outputs a logic state different from the input bit and the remaining memory cells output the same logic state as the input bit, the single memory cell may be determined to be a single defective memory cell.

The third test circuit may determine whether the defective memory cell is an adjacent double defective memory cell. Among the target memory cells, when a pair of memory cells adjacent to each other output a logic state different from the input bit and the remaining memory cells output the same logic state as the input bit, the pair of memory cells may be determined to be the adjacent double defective memory cell. As described herein, "a pair of memory cells adjacent to each other" may refer to a pair of memory cells connected to the same word line and with no other memory cell therebetween.

According to an example embodiment of the present disclosure, the first to third test circuits 332, 334, and 336 may transmit parallel test results to the control circuit 340. The parallel test results may include output signals (OUT1 to OUT3, OUT) and address information (ADD1 to ADD3, ADD) of the first to third test circuits 332, 334, and 336.

For example, the first output signal OUT1 of the first test circuit 332 may indicate whether a defective memory cell has been determined for the target memory bank. The first address information ADD1 of the first test circuit 332 may correspond to address information of the defective memory cell.

For example, the second output signal OUT2 of the second test circuit 334 may indicate whether the defective memory cell is a single defective memory cell. The second address information ADD2 of the second test circuit 334 may correspond to address information of the single defective memory cell.

For example, the third output signal OUT3 of the third test circuit 336 may indicate whether the defective memory cell is an adjacent double defective memory cell. Third address information AD3 of the third test circuit 336 may correspond to address information of the adjacent double defective memory cell.

According to an example embodiment of the present disclosure, the control circuit 340 may control performance of the parallel test of the BIST circuit 330. Additionally, when the defective memory cell is not a single defective memory cell or an adjacent double defective memory cell, the control circuit 340 may determine the target memory bank to be the defective memory bank. In this case, the control circuit 340 may use the first to third output signals (OUT) or the first to third address information (ADD).

The control circuit 340 may transmit test results to the memory controller 210 (see FIG. 1). The test results may include whether the target memory bank is defective and/or the first to third addresses (ADD1 to ADD3). The memory controller may perform a repair operation on the defective memory cells included in the defective memory bank. For example, through the repair operation, the defective memory cell may be replaced with another memory cell, a word line to which the defective memory cell is connected may be mapped to another word line, or a bit line to which the defective memory cell is connected may be mapped to another bit line. However, the present disclosure may not be limited thereto.

The memory device 300 according to an example embodiment of the present disclosure may determine the target memory bank to be a defective memory bank when the defective memory cell is not a single defective memory cell or an adjacent double defective memory cell. In other words, when the defective memory cell is an adjacent double defective memory cell, the repair operation may not be performed on the target memory bank by determining the target memory bank to be a normal memory bank.

Figure 3:
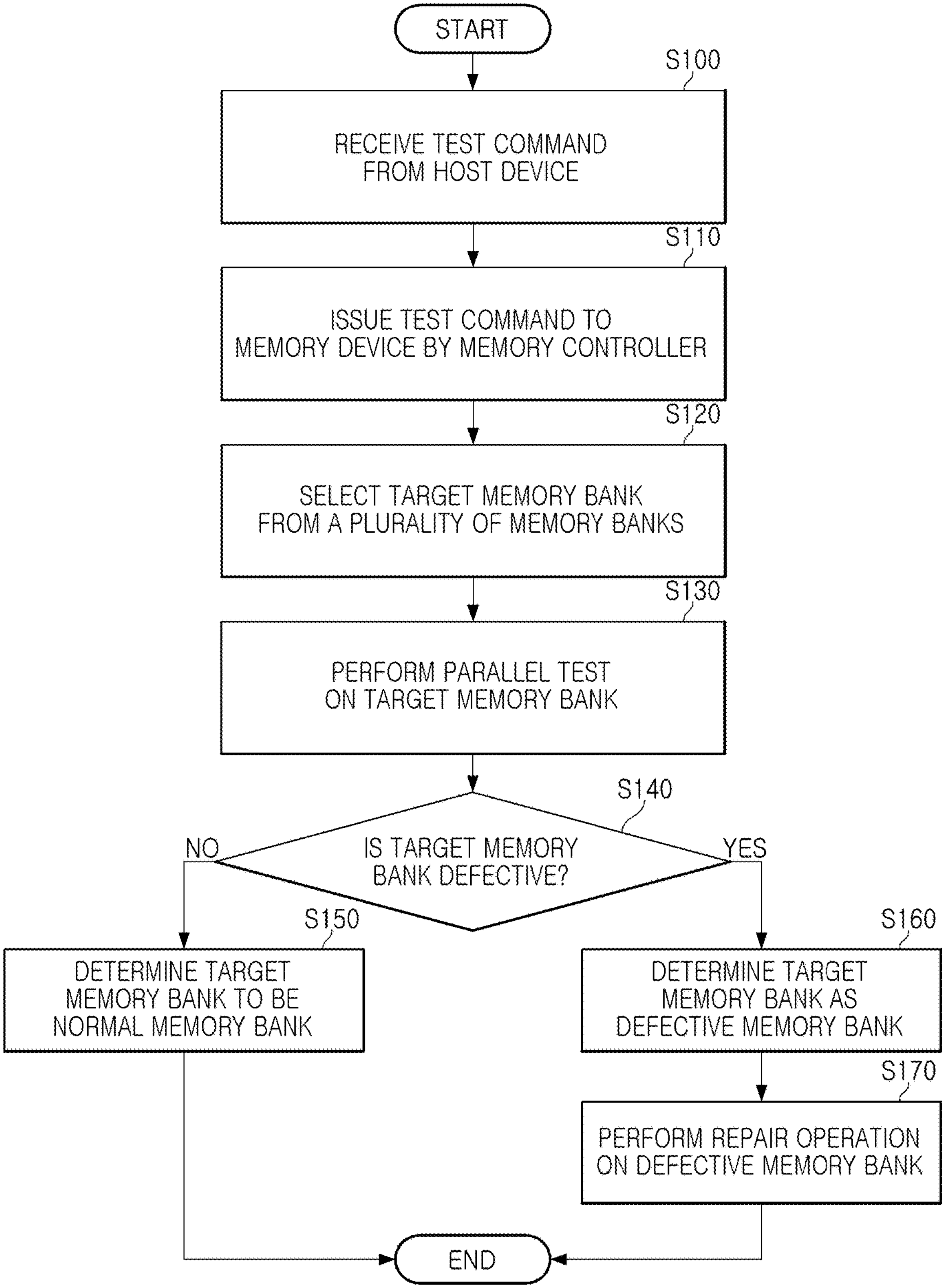
FIG. 3 is a flowchart illustrating a process of selecting a defective memory bank in a memory device according to an example embodiment of the present disclosure.

FIG. 3 is a flowchart illustrating a process of selecting a defective memory bank in a memory device according to an example embodiment of the present disclosure.

In an example embodiment of the present disclosure, a host-memory system may include a host device and a memory system. The host device and the memory system may be connected according to various standard interfaces. The memory system may include a memory controller, a memory device, and a memory interface. Specific embodiments of the host-memory system may be similar to those described in FIG. 1.

In an example embodiment of the present disclosure, a memory device may include a memory core, a BIST circuit, and a control circuit. The memory core may include a plurality of memory banks, and each of the plurality of memory banks may include a plurality of memory cells. The BIST circuit may select a target memory bank from the plurality of memory banks and may perform a parallel test on the target memory bank. The control circuit may control performance of the parallel test of the BIST circuit. Specific embodiments of the memory device may be similar to those described in FIG. 2.

The memory device may perform a parallel test on each of the plurality of included memory banks. Through the parallel test, defective memory banks may be selected, and when a memory bank is defective, a repair operation may be performed to rescue the memory device. Hereinafter, a process for selecting a defective memory bank in a memory device according to an example embodiment of the present disclosure will be described.

The memory device may receive a test command from the host device (S100). In other words, the host device may issue a test command to the memory device. The memory controller may issue a test command to the memory device to detect a memory cell for outputting a logic state different from an input bit (S110).

The memory device may perform a parallel test operation for each of the plurality of memory banks in response to the received test command. For example, the memory device may sequentially perform parallel test operations on all memory banks. The BIST circuit may select a target memory bank from a plurality of memory banks (S120).

The BIST circuit may perform a parallel test on the target memory bank (S130). The BIST circuit may provide read and write commands to a read/write bus to perform the parallel test. The same data may be written to each of the target memory cells included in the target memory bank by a write command. Data written in each target memory cell may be read by a read command. Specific embodiments may be similar to those described in FIG. 2.

According to an example embodiment of the present disclosure, the BIST circuit may determine whether read data of the target memory cells is identical to write data. In other words, the BIST circuit may determine whether an output bit output from the target memory cells is identical to a logical state of the input bits. In this case, the BIST circuit may determine that a target memory cell for outputting the logic state different from the input bit among the target memory cells is a defective memory cell.

In the target memory bank in which a defective memory cell is determined, the BIST circuit may determine whether the defective memory cell is a single memory cell or a pair of adjacent memory cells. Additionally, the BIST circuit may transmit parallel test results to the control circuit. The parallel test results may include output signals and address information, and specific embodiments may be similar to those described in FIG. 2.

The control circuit may determine whether the target memory bank is defective (S140). When the defective memory cell is not defective (NO in S140), the control circuit may determine the target memory bank to be a normal memory bank (S150). When the defective memory cell is defective (YES in S140), the control circuit may determine the target memory bank to be the defective memory bank (S160).

The control circuit may transmit the test results to the memory controller, and the memory controller may perform a repair operation on the defective memory bank (S170). For example, through the repair operation, the defective memory cell is replaced with another memory cell, a word line to which the defective memory cell is connected may be mapped to another word line, or a bit line to which the defective memory cell is connected may be mapped to another bit line. However, the present disclosure may not be limited thereto.

Hereinafter, a process (S120 and S130) in which the BIST circuit performs a parallel test on the target memory bank and the control circuit determines whether the target memory bank is defective will be described in detail.

Figure 4:
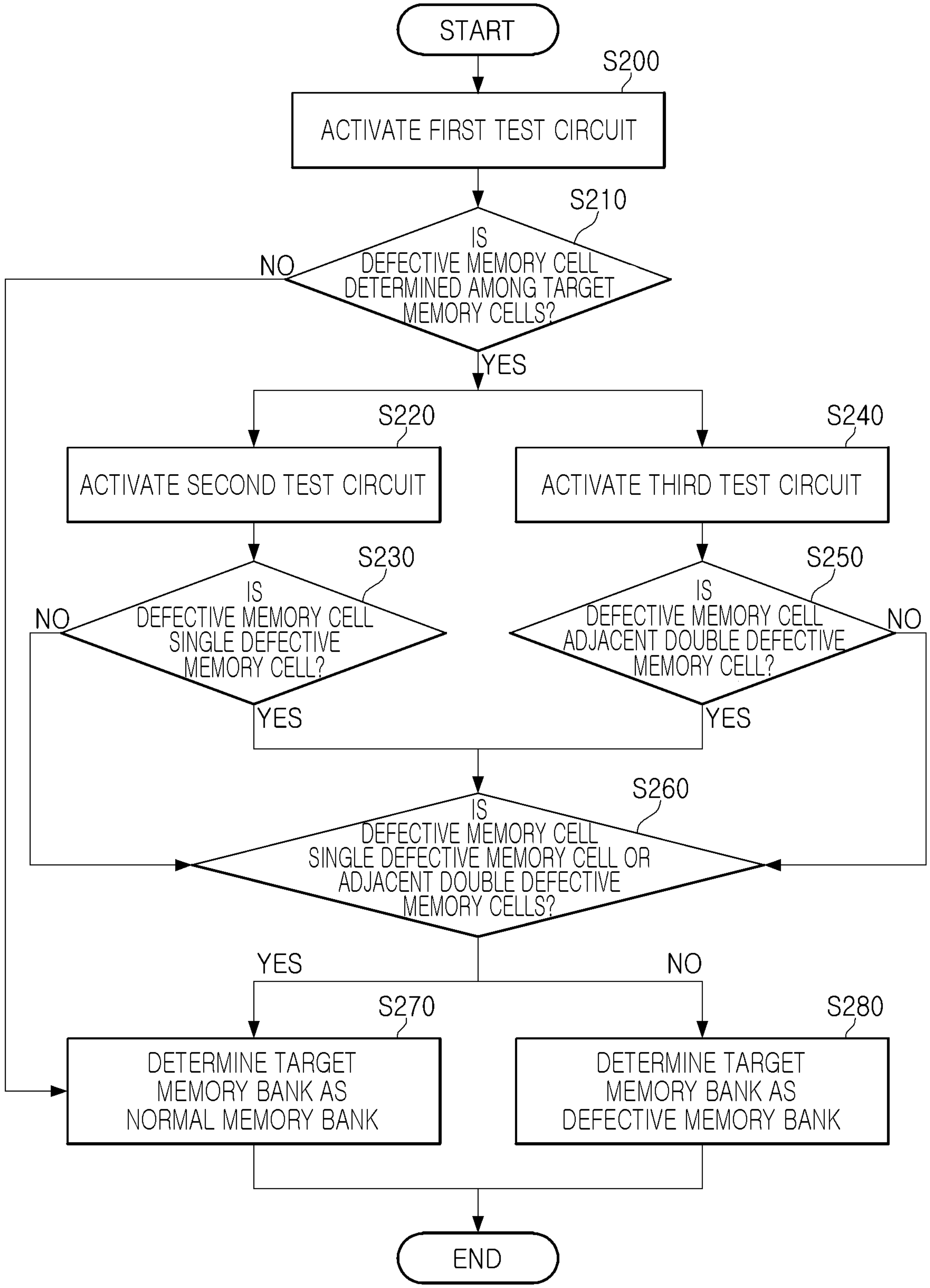
FIG. 4 is a flowchart illustrating a process of performing a parallel test on a target memory bank and determining whether the target memory bank is defective according to an example embodiment of the present disclosure.

FIG. 4 is a flowchart illustrating a process of performing a parallel test on a target memory bank and determining whether the target memory bank is defective according to an example embodiment of the present disclosure.

In an example embodiment of the present disclosure, a host-memory system may include a host device and a memory system. The memory system may include a memory controller, a memory device, and a memory interface. The memory device may include a memory core, a BIST circuit, and a control circuit. The memory core may include a plurality of memory banks, and each of the plurality of memory banks may include a plurality of memory cells.

According to an example embodiment of the present disclosure, the BIST circuit may include a first test circuit, a second test circuit, and a third test circuit, and may perform a parallel test on the target memory bank. The control circuit may control the parallel test performed by the BIST circuit. Specific embodiments of the host-memory system and the memory device may be similar to those described in FIGS. 1 to 3.

First, the BIST circuit may activate the first test circuit (S200). The first test circuit may determine a defective memory cell, among target memory cells included in the target memory bank. The first test circuit may determine at least one memory cell for outputting a logic state different from the input bit, among the target memory cells, as a defective memory cell.

When no defective memory cell is determined among the target memory cells (NO in S210), the target memory bank may be determined to be a normal memory bank (S270). When a defective memory cell is determined among the target memory cells (YES in S210), the BIST circuit may determine whether the defective memory cell is a single defective memory cell or an adjacent double defective memory cell (S220 to S250).

Specifically, when a defective memory cell is determined among the target memory cells (YES in S210), the BIST circuit may activate a second test circuit and a third test circuit (S220 and S240).

The second test circuit may determine whether the defective memory cell is a single defective memory cell (S230). Among the target memory cells, when the single memory cell outputs a logic state different from the input bit and the remaining memory cells output the same logic state as the input bit, the single memory cell may be determined to be the single defective memory cell.

The third test circuit may determine whether the defective memory cell is an adjacent double defective memory cell (S250). Among the target memory cells, when a pair of memory cells adjacent to each other output a logic state different from the input bit, and the remaining memory cells output the same logic state as the input bit, the pair of memory cells may be determined to be the adjacent double defective memory cell.

The control circuit may determine whether the defective memory cell is a single defective memory cell or an adjacent double defective memory cell (S260). In this case, the control circuit may use output signals of the first to third test circuits.

When the defective memory cell is a single defective memory cell or adjacent double defective memory cell (YES in S260), the control circuit may determine the target memory bank to be a normal memory bank (S270). A repair operation may not be performed on the normal memory bank.

When the defective memory cell is not a single defective memory cell or an adjacent double defective memory cell (NO in S260), the control circuit may determine the target memory bank to be a defective memory bank (S280). The control circuit may transmit test results including information on the defective memory bank to the memory controller, and the memory controller may perform the repair operation on a defective memory bank. For example, as discussed above, through the repair operation, the defective memory cell is replaced with another memory cell (e.g., a repair memory cell), a word line to which the defective memory cell is connected may be mapped to another word line, or a bit line to which the defective memory cell is connected may be mapped to another bit line. However, the present disclosure may not be limited thereto.

The BIST circuit of an example embodiment of the present disclosure may determine a memory bank in which the defective memory cell is a single defective memory cell and an adjacent double defective memory cell, as a normal memory bank, and thus, an unnecessary repair operation may not be performed on the single defective memory cell or an adjacent double defective memory cell.

Figure 5:
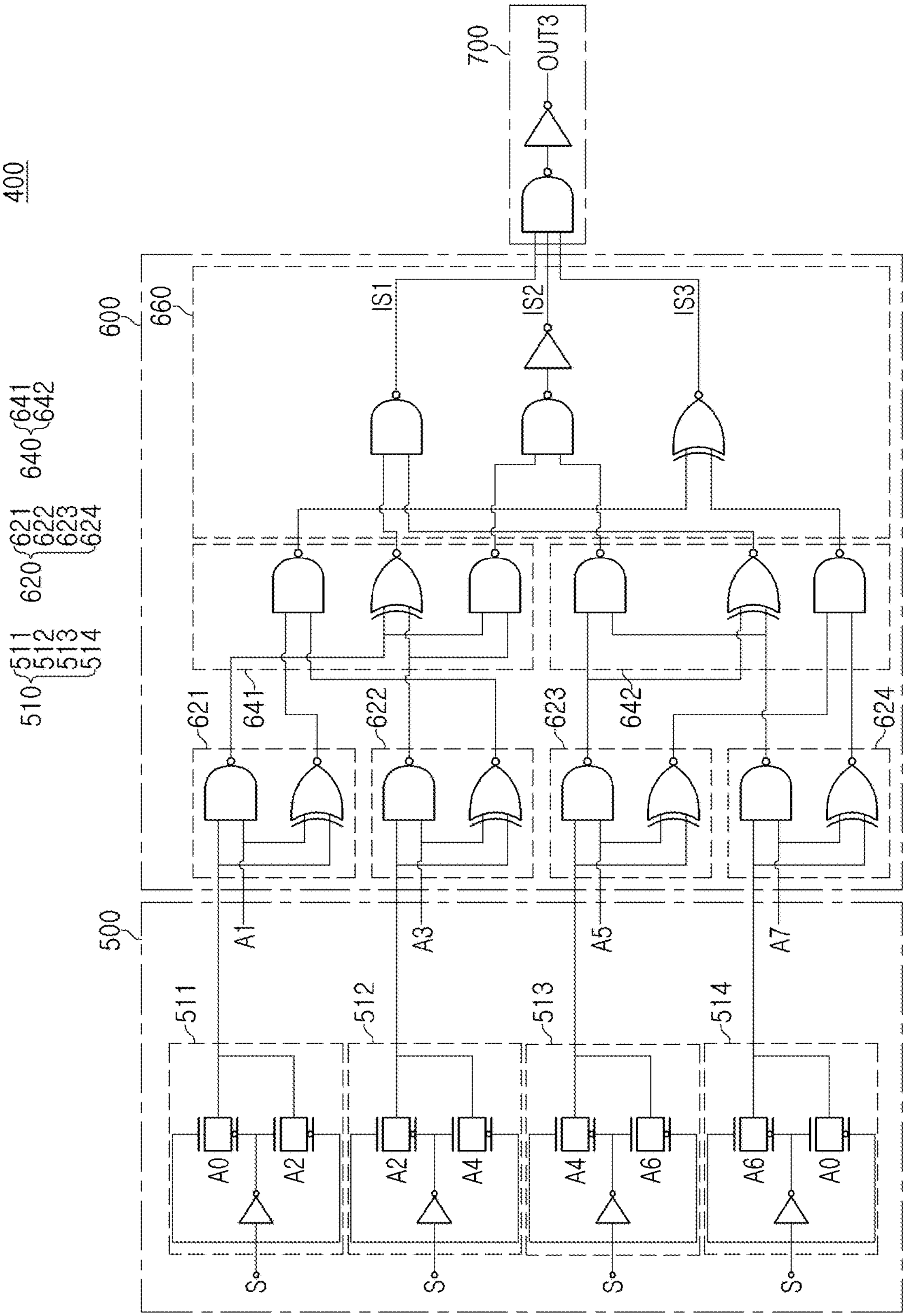
FIG. 5 is a view illustrating a third test circuit according to an example embodiment of the present disclosure.

FIG. 5 is a view illustrating a third test circuit according to an example embodiment of the present disclosure.

In an example embodiment of the present disclosure, a memory device may include a memory core, a BIST circuit, and a control circuit. The memory core may include a plurality of memory banks, and each of the plurality of memory banks may include a plurality of memory cells. The BIST circuit may select a target memory bank from the plurality of memory banks, and may perform a parallel test on the target memory bank. The control circuit may control performance of a parallel test of the BIST circuit. Specific embodiments of the memory device may be similar to those described in FIGS. 1 to 4.

According to an example embodiment of the present disclosure, the BIST circuit may include first to third test circuits. When a pair of memory cells adjacent to each other among the target memory cells included in the target memory bank output a defective bit, the third test circuit may determine the pair of memory cells to be adjacent double defective memory cell. In other words, the third test circuit may determine whether a defective memory cell for outputting a logic state different from an input bit among the target memory cells is an adjacent double defective memory cell.

Each of the plurality of memory banks may include a plurality of word lines and a plurality of bit lines, and may connect the plurality of memory cells to the plurality of word lines and the plurality of bit lines. A pair of memory cells may be connected to one word line among a plurality of word lines and a pair of adjacent bit lines among a plurality of bit lines. In this case, the pair of bit lines may be determined by a control circuit.

First, referring to FIG. 5, a third test circuit 400 may include an input unit 500, a logic unit 600, and an output unit 700. The input unit 500 may receive a selection signal S from the first test circuit and bit determination signals A0 to A7 from the control circuit. The bit determination signals A0 to A7 may indicate whether a 0th to seventh target memory cells output defective bits. The 0th to seventh target memory cells may correspond to all or some of the target memory cells.

The 0th to seventh target memory cells may be connected to one word line, among the plurality of word lines, and bit lines adjacent to each other, among the plurality of bit lines. In this case, the number of bit lines adjacent to each other may be equal to the number of 0th to seventh target memory cells. As described herein, "bit lines adjacent to each other" may refer to a pair of bit lines that are disposed next to each other with no other bit line disposed between the pair of bit lines. As such, "bit lines adjacent to each other" may refer to a pair of bit lines directly adjacent to each other.

The 0th to seventh target memory cells may be divided into first to fourth pairs of memory cells adjacent to each other. Accordingly, the bit determination signals A0 to A7 may also be divided into first to fourth pairs of bit determination signals. For example, the first pair of memory cells may be connected to one word line and a pair of bit lines adjacent to each other. In this case, the pair of bit lines may be determined by the selection signal S.

According to an example embodiment of the present disclosure, the input unit 500 may include a plurality of multiplexers (511-514; 510), and each of the plurality of multiplexers 510 may include an inverter and transmission gates connected in parallel. The input unit 500 may output a pair of bit determination signals corresponding to a pair of memory cells among the bit determination signals A0 to A7 to the logic unit 600. Specifically, the pair of bit determination signals may be output to a plurality of half adders (621-624; 620) included in the logic unit 600.

According to an example embodiment of the present disclosure, the input unit 500 may receive the selection signal S and 2n-2th to 2nth bit determination signals. In this case, n corresponds to a natural number of 1 or more and may be the same hereinafter. The input unit 500 may output a 2n-1th bit determination signal to a nth half adder among the plurality of half adders 621 to 624.

The selection signal S, and the 2n-2th and 2nth bit determination signals may be input to a nth multiplexer among the plurality of multiplexers 510. The nth multiplexer may output one of the 2n-2th and 2nth bit determination signals to the nth half adder according to the selection signal S. The nth multiplexer may output the 2n-2th bit determination signal when the selection signal S is in a first state (high), and may output the 2nth bit determination signal when the selection signal S is in a second state (low).

In an example embodiment, the input unit 500 may receive the selection signal S and 0th to second bit determination signals A0 to A2, and may output the first bit determination signal A1 to the first half adder 621. The selection signal S and the 0th and second bit determination signals (A0 and A2) may be input to the first multiplexer 511.

In an embodiment of the present disclosure, when the selection signal S is in the first state (high), the first multiplexer 511 may output the 0th bit determination signal A0 to the first half adder 621. That is, 0th and first target memory cells may correspond to a pair of memory cells adjacent to each other.

In another example embodiment of the present disclosure, when the selection signal S is in the second state (low), the first multiplexer 511 may output the first bit determination signal A1 to the first half adder 621. That is, the first and second target memory cells may correspond to a pair of memory cells adjacent to each other.

According to an example embodiment of the present disclosure, the logic unit 600 may output first to third internal signals IS1 to IS3 using an output of the input unit 500. The logic unit 600 may include a first logic unit (621-624; 620), a second logic unit (641-642; 640), and a third logic unit 660.

The first logic unit 620 may include a plurality of half adders 621 to 624. The plurality of half adders 621 to 624 may perform a NAND logic operation and an XNOR logic operation on bit determination signals corresponding to a pair of memory cells.

The second logic unit 640 may include a plurality of second logic circuits 641 and 642. The second logic circuits 641 and 642 may perform a first NAND logic operation, a second NAND logic operation, and an XOR logic operation on outputs of a pair of adjacent half adders among the plurality of half adders 621 to 624.

The third logic unit 660 may include at least one third logic circuit. The third logic circuit may perform a NAND logic operation, an AND logic operation, and a NOR logic operation on outputs of the second logic unit 640 to output first to third internal signals IS1 to IS3.

The first internal signal IS1 may indicate whether the first pair of output bits are defective bits or whether the second to fourth pairs of output bits are defective bits, among the first to fourth pairs of output bits output from the first to fourth pairs of memory cells adjacent to each other among the target memory cells.

Among the first to fourth pairs of output bits output from the first to fourth pairs of memory cells adjacent to each other among the target memory cells, the second internal signal IS2 may indicate whether there are no defective bits, or a pair of output bits are defective bits, among the first and second pairs of output bits, and whether there are no defective bits, or a pair of output bits are defective bits, among the third and fourth pairs of output bits.

The third internal signal IS3 may indicate whether the first to fourth pairs of output bits output from the first to fourth pairs of memory cells adjacent to each other, among the target memory cells, are all defective bits or normal bits.

The output unit 700 may use the first to third internal signals IS1 to IS3 to output a third output signal OUT3 indicating whether a pair of memory cells are adjacent double defective memory cell. For example, the output unit 700 may perform an AND logic operation on the first to third internal signals IS1 to IS3 and may output the third output signal OUT3. The third output signal OUT may indicate whether the defective memory cell included in the target memory cell is an adjacent double defective memory cell.

Hereinafter, the third output signal OUT3 output from the third test circuit 400 according to example embodiments of the present disclosure will be described in detail.

FIGS. 6 and 7 are views illustrating signals of a third test circuit according to example embodiments of the present disclosure.

A memory device according to an example embodiment of the present disclosure may include a memory core, a BIST circuit, and a control circuit, and the BIST circuit may include first to third test circuits. When a pair of memory cells adjacent to each other among the target memory cells output defective bits, the third test circuit may determine the pair of memory cells to be adjacent double defective memory cell. Specific embodiments of the memory device and the BIST circuit may be similar to those described in FIGS. 1 to 5.

FIGS. 6 and 7 may illustrate first to third internal signals IS1 to IS3 and a third output signal OUT3 of the third test circuit.

First, referring to FIG. 6, a selection signal received by the third test circuit corresponds to a first state (high), and 0th and first, second and third, . . . bit determination signals (A0 and A1, A2 and A3, . . . ) may correspond to bit determination signals corresponding to a pair of memory cells. In other words, each of 0th and first, second and third, . . . target memory cells may correspond to a pair of memory cells adjacent to each other, and may correspond to first to fourth pairs of memory cells. Specific embodiments may be similar to those described in FIG. 5.

The bit determination signals A0 to A7 may be divided into first to sixth cases CASE1 to CASE6, and the bit determination signals A0 to A7 may have various combinations of values. A normal bit may denote that an output bit output from the target memory cell is in the same logic state as the input bit, and a defective bit may denote that an output bit is in a logical state different from the input bit.

'0' in the bit determination signal may indicate that the target memory cell corresponding to the bit determination signal outputs the normal bit, and the target memory cell may correspond to a normal memory cell. '1' in the bit determination signal may indicate that the target memory cell corresponding to the bit determination signal outputs a defective bit, and the target memory cell may correspond to a defective memory cell.

The first case CASE1 may correspond to a case in which all of the first to fourth pairs of target memory cells output defective bits because all of the 0th to seventh bit determination signals A0 to A7 have a value of 1. Since the first case CASE1 does not correspond to a case in which the first pair of output bits are defective bits or the second to fourth pairs of output bits are defective bits, the first internal signal IS1 may correspond to the second state L. Since two pairs of output bits among the first and second pairs of output bits are defective bits, and two pairs of output bits among the third and fourth pairs of output bits are defective bits, the second internal signal IS2 may correspond to the second state L. However, since each of the first to fourth pairs of output bits is identical to a defective bit, the third internal signal IS3 may correspond to the first state H. When performing the AND logic operation on the first to third internal signals IS1 to IS3, the third output signal OUT3 may correspond to the second state L. That is, in the first case CASE1, the defective memory cell may be determined not to be an adjacent double defective memory cell.

The second case CASE2 may correspond to a case in which the first to third pairs of target memory cells may output defective bits because the 0th to fifth bit determination signals A0 to A5 may have a value of 1 and the sixth and seventh bit determination signals A6 and A7 may have a value of 0. Since the first to third pairs of output bits are defective bits, the first internal signal IS1 may correspond to the first state H. Since two pairs of output bits, among the first and second pairs of output bits, are defective bits, the second internal signal IS2 may correspond to the second state L. Since each of the first to third pairs of output bits are all identical as defective bits and each of the fourth pair of output bits is identical as the normal bit, the third internal signal IS3 may correspond to the first state H. When performing the AND logic operation on the first to third internal signals IS1 to IS3, the third output signal OUT3 may correspond to the second state L. That is, in the second case CASE2, the defective memory cell may be determined not to be an adjacent double defective memory cell.

The third case CASE3 may correspond to a case in which the first and second pairs of target memory cells output defective bits because the 0th to third bit determination signals A0 to A3 may have a value of 1 and the fourth and seventh bit determination signals A4 to A7 may have a value of 0. Since the third case CASE3 does not correspond to a case in which the first pair of output bits are defective bits or the second to fourth pairs of output bits are defective bits, the first internal signal IS1 may correspond to the second state L. Since two pairs of output bits among the first and second pairs of output bits are defective bits, the second internal signal IS2 may correspond to the second state L. Since each of the first and second pairs of output bits is all identical as defective bits, and each of the third and fourth pairs of output bits is all identical as normal bits, the third internal signal IS3 may correspond to the first state H. When performing the AND logic operation on the first to third internal signals IS1 to IS3, the third output signal OUT3 may correspond to the second state L. That is, in the third case CASE3, the defective memory cell may be determined not to be an adjacent double defective memory cell.

The fourth case CASE4 may correspond to a case in which the first and third pairs of target memory cells may output defective bits, and the second and fourth pairs of target memory cells may output normal bits. Since the fourth case CASE4 does not correspond to a case in which the first pair of output bits are defective bits or the second to fourth pairs of output bits are defective bits, the first internal signal IS1 may correspond to the second state L. Since the first pair of output bits, among the first and second pairs of output bits, are defective bits, and the third pair of output bits, among the third and fourth pairs of output bits, are defective bits, the second internal signal IS2 may correspond to the first state H. Since each of the first to fourth pairs of output bits equally outputs a defective bit or a normal bit, the third internal signal IS3 may correspond to the first state H. When performing the AND logic operation on the first to third internal signals IS1 to IS3, the third output signal OUT3 may correspond to the second state L. That is, in the fourth case CASE4, the defective memory cell may be determined not to be an adjacent double defective memory cell.

The fifth case CASE5 may correspond to a case in which the first pair of target memory cells may output defective bits, and the second to fourth pairs of target memory cells may output normal bits. Since the first pair of output bits are defective bits, the first internal signal IS1 may correspond to the first state H. Since the first pair of output bits, among the first and second pairs of output bits, are defective bits and there are no defective bits among the third and fourth pairs of output bits, the second internal signal IS2 may correspond to the first state H. Since each of the first to fourth pairs of output bits equally outputs a defective bit or a normal bit, the third internal signal IS3 may correspond to the first state H. When the AND logic operation is performed on the first to third internal signals IS1 to IS3, the third output signal OUT3 may correspond to the first state H. That is, in the fifth case CASE5, the third test circuit may determine the first pair of memory cells as adjacent double defective memory cell.

The sixth case CASE6 may correspond to a case in which all of the first to fourth pairs of target memory cells output normal bits. Since the sixth case CASE6 does not correspond to a case in which the first pair of output bits are defective bits or the second to fourth pairs of output bits are defective bits, the first internal signal IS1 may correspond to the second state L. Since there are no defective bits among the first and second pairs of output bits and there are no defective bits among the third and fourth pairs of output bits, the second internal signal IS2 may correspond to the first state H. Since each of the first to fourth pairs of output bits equally outputs a normal bit, the third internal signal IS3 may correspond to the first state H. When performing the AND logic operation on the first to third internal signals IS1 to IS3, the third output signal OUT3 may correspond to the second state L. That is, in the sixth case CASE6, the defective memory cell may be determined to not be an adjacent double defective memory cell.

Referring to FIG. 7, in a case in which a selection signal received by the third test circuit is in the second state (low), the first and second, third and fourth, . . . bit determination signals (A1 and A2, A3 and A4, . . . ) may correspond to bit determination signals corresponding to a pair of memory cells. In other words, the first and second, third and fourth, . . . target memory cells each correspond to a pair of memory cells adjacent to each other and may correspond to the first to fourth pairs of memory cells. Specific embodiments may be similar to those described in FIG. 5.

The bit determination signals A1 to A0 may be divided into the first to sixth cases CASE1 to CASE6. Specific embodiments of the determination of the first to third internal signals IS1 to IS3 and the third output signal OUT3 may be similar to those described previously with reference to FIG. 6.

FIGS. 8A, 8B, 9A, 9B, 10A, 10B, 11A, 11B, 12A, and 12B are diagrams illustrating output signals according to performing a target memory bank and a parallel test according to example embodiments of the present disclosure.

Specific embodiments of a memory device and BIST circuit according to an example embodiment of the present disclosure may be similar to those described in FIGS. 1 to 7. The BIST circuit of an example embodiment of the present disclosure may include first to third test circuits. The first to third test circuits may determine target memory cells included in the target memory bank.

The first test circuit may determine a defective memory cell and output a first output signal OUT1 and/or an address of a defective memory cell. The second test circuit determines whether the defective memory cell is a single defective memory cell, and may output a second output signal OUT2 and/or an address of a single defective memory cell. The third test circuit may determine whether the defective memory cell is an adjacent double-defective memory cell, and may output a third output signal OUT3 and/or an address of the adjacent double-defective memory cell.

The control circuit may use an output of the first to third test circuits to determine whether the defective memory cell is a single defective memory cell or an adjacent double defective memory cell. When the defective memory cell is not a single defective memory cell or an adjacent double defective memory cell, the control circuit may determine the target memory bank to be the defective memory bank.

FIGS. 8A, 9A, 10A, 11A, and FIG. 12A may represent a target memory bank and bit determination signals according to an example embodiment of the present disclosure. FIGS. 8B, 9B, 10B, 11B, and to FIG. 12B may represent first to third output signals OUT1 to OUT3 according to an example embodiment of the present disclosure.

Referring to FIGS. 8A, 9A, 10A, 11A, and FIG. 12A, the target memory bank may include a plurality of word lines WL0 to WL7 and a plurality of bit lines BL0 to BL7. However, the present disclosure is not limited thereto and may include a plurality of bit lines BL0 to BL15. The target memory cells may be connected to the plurality of word lines WL0 to WL7 and the plurality of bit lines BL0 to BL7. It may be understood that a rectangular region in FIGS. 8A, 9A, 10A, 11A, and FIG. 12A corresponds to a target memory cell.

According to an example embodiment of the present disclosure, the target memory cells may be divided into a plurality of regions. Each of the plurality of regions may include target memory cells connected to the same word line among the plurality of word lines WL0 to WL7 and the plurality of bit lines BL0 to BL7. For example, one of the plurality of regions may include target memory cells connected to a 0th word line (i.e., WL0) and the plurality of bit lines BL0 to BL7.

According to an example embodiment of the present disclosure, target memory cells connected to the same word line among the plurality of word lines WL0 to WL7 and a pair of adjacent bit lines among the plurality of bit lines BL0 to BL7 may correspond to a pair of memory cells adjacent to each other. This may be determined according to the selection signal received by the third test circuit, and specific embodiments may be similar to those described in FIGS. 5 to 7.

In the target memory bank illustrated in FIGS. 8A, 9A, 10A, 11A, and FIG. 12A, target memory cells connected to the same word line and a pair of bit lines (BL0 and BL1, BL2 and BL3, . . . ) adjacent to each other may correspond to a pair of memory cells. For example, the target memory cells connected to the 0th word line WL0 and the 0th and first bit lines BL0 and BL1 may correspond to a pair of memory cells adjacent to each other.

Each of the bit determination signals illustrated in FIGS. 8A, 9A, 10A, 11A, and FIG. 12A may correspond to a target memory cell. '0' in the bit determination signal may indicate that the target memory cell corresponding to the bit determination signal outputs a normal bit, and the target memory cell may correspond to a normal memory cell. '1' in the bit determination signal may indicate that the target memory cell corresponding to the bit determination signal outputs a defective bit, and the target memory cell may correspond to a defective memory cell.

Referring to FIGS. 8B, 9B, 10B, 11B, and FIG. 12B, in order to determine whether the target memory bank is defective, the BIST circuit may output first to third output signals OUT1 to OUT3 for each of a plurality of regions included in the target memory bank.

The first test circuit may determine at least one memory cell for outputting a defective bit among the target memory cells to be a defective memory cell, and the first output signal OUT1 may be output in the second state L with respect to a region including a defective memory cell among the plurality of regions. Additionally, the second and third test circuits may be activated only when a defective memory cell is determined in the first test circuit.

When one memory cell among the target memory cells outputs a defective bit, the second test circuit may determine the one memory cell to be a single defective memory cell. That is, the defective memory cell may be a single defective memory cell. The second output signal OUT2 may be output in the first state H with respect to a region including a single defective memory cell among the plurality of regions.

When a pair of adjacent memory cells among the target memory cells output defective bits, the third test circuit may determine a pair of memory cells to be adjacent double defective memory cell. That is, the defective memory cell may be an adjacent double defective memory cell. The third output signal OUT3 may be output in the first state H with respect to a region including the adjacent double defective memory cell among the plurality of regions.

For example, for at least one region in which the first output signal OUT1 is output in the second state L, among the plurality of regions, when the second output signal OUT2 and the third output signal OUT3 are output in the second state L, the control circuit may determine the target memory bank to be a defective memory bank.

As another example, at least one region in which the first output signal OUT1 is output in the second state L among the plurality of regions, when the second output signal OUT2 or the third output signal OUT3 is output in the first state H, the control circuit may determine the target memory bank to be a normal memory bank.

Referring to FIG. 8A, this may correspond to a case in which all bit determination signals have a value of 0. In other words, all of the target memory cells may correspond to normal memory cells for outputting a normal bit. Referring to FIG. 8B, since there are no regions including defective memory cells among the plurality of regions, the first output signal OUT1 for the plurality of regions are all output in the first state H, and the second and third test circuits may not be activated. That is, the control circuit may determine the target memory bank to be a normal memory bank.

Referring to FIG. 9A, this may correspond to a case in which one bit determination signal has a value of 1. In other words, since one memory cell among the target memory cells outputs a defective bit, a target memory cell corresponding to the one bit determination signal may correspond to a defective memory cell or a single defective memory cell.

Referring to FIG. 9B, the first test circuit may output the first output signal OUT1 in the second state L with respect to a region including a defective memory cell among a plurality of regions. The second test circuit may output the second output signal OUT2 in the first state H with respect to a region including a single defective memory cell, among the plurality of regions. The third test circuit may output all third output signals OUT3 for the plurality of regions in the second state L.

This may correspond to a case in which the second output signal OUT2 is output in the first state H for a region in which the first output signal OUT1 is output in the second state L, among the plurality of regions. Accordingly, the control circuit may determine the target memory bank to be a normal memory bank.

Referring to FIG. 10A, this may correspond to a case in which a pair of bit determination signals adjacent to each other have a value of 1. In other words, since a pair of memory cells adjacent to each other, among the target memory cells, output a defective bit, a pair of target memory cells corresponding to the pair of bit determination signals may correspond to a defective memory cell and an adjacent double defective memory cell.

Referring to FIG. 10B, the first test circuit may output the first output signal OUT1 in the second state L with respect to a region including a defective memory cell among the plurality of regions. The second test circuit may output all of the second output signals OUT2 for the plurality of regions in the second state L. The third test circuit may output the third output signal OUT3 in the first state H with respect to a region including an adjacent double defective memory cell among the plurality of regions.

This may correspond to a case in which the third output signal OUT3 is output in the first state H for a region in which the first output signal OUT1 is output in the second state L, among the plurality of regions. Accordingly, the control circuit may determine the target memory bank to be a normal memory bank.

Referring to FIG. 11A, target memory cells corresponding to bit determination signals having a value of 1 may not be adjacent to each other. In other words, the target memory cells correspond to defective memory cells, but may not be adjacent double defective memory cell.

Referring to FIG. 11B, the first test circuit may output the first output signal OUT1 in the second state L with respect to a region including a defective memory cell, among a plurality of regions. The second and third test circuits may output both the second and third output signals OUT2 and OUT3 for the plurality of regions in the second state L.

This may be a case in which the second and third output signals OUT2 and OUT3 are output in the second state L with respect to a region in which the first output signal OUT1 is output in the second state L, among the plurality of regions. Accordingly, the control circuit may determine the target memory bank to be a defective memory bank.

Referring to FIG. 12A, since there are a total of three target memory cells corresponding to bit determination signals having a value of 1, the target memory cells correspond to defective memory cells, but may not be single defective memory cells or adjacent double defective memory cell.

Referring to FIG. 12B, the first test circuit may output the first output signal OUT1 in the second state L with respect to a region including a defective memory cell, among the plurality of regions. The second and third test circuits may output both the second and third output signals OUT2 and OUT3 for the plurality of regions in the second state (L).

This may correspond to a case in which the second and third output signals OUT2 and OUT3 are output in the second state L with respect to a region in which the first output signal OUT1 is output in the second state L, among the plurality of regions. Accordingly, the control circuit may determine the target memory bank to be a defective memory bank.

In another example embodiment of the present disclosure, the control circuit may determine whether the target memory bank is defective using an address of the memory cell.

The first test circuit may determine a defective memory cell among the target memory cells, and may output a first address of the defective memory cell to the control circuit. When the defective memory cell is a single defective memory cell, the second test circuit may output a second address of the single defective memory cell to the control circuit. When the defective memory cell is an adjacent double defective memory cell, the third test circuit may output the third address of the adjacent double defective memory cell to the control circuit. When the defective memory cell is an adjacent double defective memory cell, the third test circuit may output a third address of the adjacent double defective memory cell to the control circuit.

When the first address matches the second or third address, the control circuit may determine the target memory bank to be a normal memory bank. When the first address does not match the second and third addresses, the control circuit may determine the target memory bank to be a defective memory bank.

Figure 13:
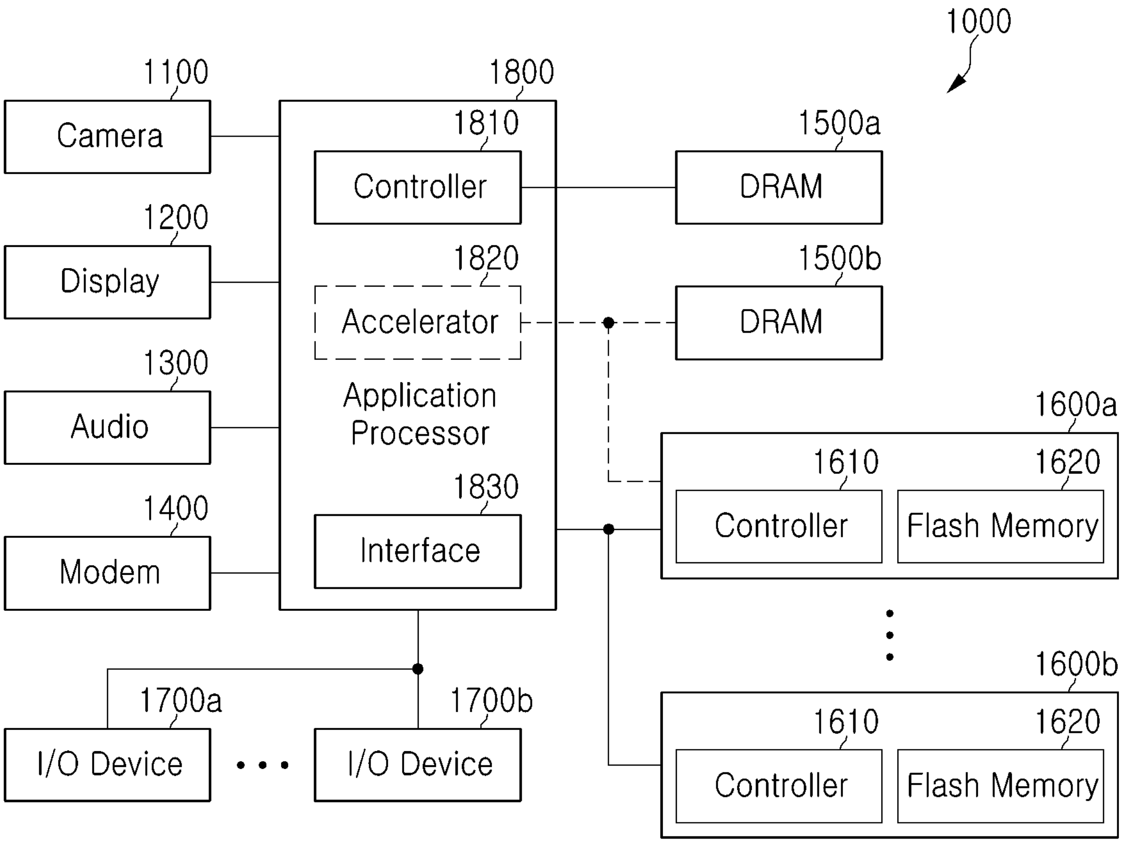
FIG. 13 is a view illustrating a system to which a memory device is applied, according to an example embodiment of the present disclosure.

FIG. 13 is a view illustrating a system to which a memory device is applied, according to an example embodiment of the present disclosure.

Referring to FIG. 13, a system 1000 may include a camera 1100, a display 1200, an audio processing unit 1300, a modem 1400, DRAMs 1500*a* and 1500*b*, flash memory devices 1600*a* and 1600*b*, I/O devices 1700*a* and 1700*b*, and an application processor 1800 (hereinafter referred to as "AP"). The system 1000 may be implemented as a laptop computer, a mobile phone, a smartphone, a tablet personal computer, a wearable device, a healthcare device, or Internet Of Things (IOT) device. Additionally, the system 1000 may be implemented as a server or a personal computer.

The camera 1100 may capture still images or moving images under user control, and may store or transmit the captured image/video data to the display 1200. The audio processing unit 1300 may process audio data included in the flash memory devices 1600*a* and 1600*b* or a network content. The modem 1400 may modulate and transmit signals for wired/wireless data transmission and reception, and may perform demodulation to restore an original signal at a receiving side. The I/O devices 1700*a* and 1700*b* may include devices for providing digital input/output functions, such as Universal Serial Bus (USB) or storage, a digital camera, a Secure Digital (SD) card, Digital Versatile Disc (DVD), a network adapter, a touch screen, and the like.

The AP 1800 may control an overall operation of the system 1000. The AP 1800 may control the display 1200 so that a portion of a content stored in the flash memory devices 1600*a* and 1600*b* is displayed on the display 1200. When the AP 1800 receives user input through the I/O devices 1700*a* and 1700*b*, a control operation corresponding to a user input may be performed. The AP 1800 may include an accelerator block, which is a dedicated circuit for Artificial Intelligence (AI) data calculation, or may be provided with an accelerator chip 1820, separate from the AP 1800. A DRAM 1500*b* may be additionally mounted on the accelerator block or the accelerator chip 1820. The accelerator is a functional block for professionally performing specific functions of the AP 1800, and the accelerator may include a GPU as a functional block for professionally performing graphics data processing, a Neural Processing Unit (NPU) as a block for professionally performing AI calculations and inference, a Data Processing Unit (DPU) as a block for professionally performing data transmission.

The system 1000 may include a plurality of DRAMs 1500*a* and 1500*b*. The AP 1800 may control the DRAMs 1500*a* and 1500*b* through a command and mode register (MRS) settings that meet the Joint Electron Device Engineering Council (JEDEC) standard, and may allow for communication by setting the DRAM interface protocol to use company-specific functions such as low voltage/high speed/reliability and Cyclic Redundancy Check (CRC)/Error Correction Code (ECC) functions. For example, the AP 1800 may communicate with the DRAM 1500*a* through an interface that complies with the JEDEC standards such as LPDDR4 and LPDDR5, and the accelerator block or the accelerator chip 1820 may perform communication by setting a new DRAM interface protocol to control the accelerator DRAM 1500*b* which has a higher bandwidth than the DRAM 1500*a*.

FIG. 13 illustrates only the DRAMs 1500*a* and 1500*b*, but the present disclosure is not limited thereto, and when the AP 1800 or the accelerator chip 1820 satisfies a bandwidth, response speed, and voltage conditions, any memory may be used, including PRAM or SRAM, MRAM, RRAM, FRAM or Hybrid RAM. The DRAMs 1500*a* and 1500*b* have relatively smaller latency and bandwidth than the I/O devices 1700*a* and 1700*b* or the flash memory devices 1600*a* and 1600*b*. The DRAMs 1500*a* and 1500*b* may be initialized when the system 1000 is powered on, and since an operating system and application data are loaded, the DRAMs 1500*a* and 1500*b* may be used as a temporary storage position for the operating system and the application data or as an execution space for various software codes.

In the DRAMs 1500*a* and 1500*b*, addition/subtraction/multiplication/division arithmetic operations, vector operations, address operations, or Fast Fourier Transform (FFT) operations may be performed. Additionally, a function used for performance used in the inference may be performed within the DRAMs 1500*a* and 1500*b*. Here, the inference may be performed in a deep learning algorithm using an artificial neural network. The deep learning algorithm may include a training operation of learning a model through various data and an inference operation of recognizing data with the learned model. As an example, an image captured by a user through the camera 1100 is signal processed and stored in the DRAM 1500*b*, and the accelerator block or the accelerator chip 1820 may perform AI data operations to recognize data using data stored in the DRAM 1500*b* and the function used for the inference.

The DRAMs 1500*a* and 1500*b* may include a plurality of memory banks and may include a BIST circuit and a control circuit as described with reference to FIGS. 1 to 12. The DRAMs 1500*a* and 1500*b* may perform parallel tests on a target memory bank among a plurality of memory banks. When at least one defective memory cell for outputting a logic state different from the input bit is a single defective memory cell or an adjacent double defective memory cell, the DRAMs 1500*a* and 1500*b* may determine the memory bank to be normal.

The system 1000 may include a plurality of storage devices or a plurality of flash memory devices 1600*a* and 1600*b* with larger capacitance than the DRAMs 1500*a* and 1500*b*. The accelerator block or the accelerator chip 1820 may perform a training operation and AI data operation using the flash memory devices 1600*a* and 1600*b*. In an example embodiment, the flash memory devices 1600*a* and 1600*b* may more efficiently perform the training operation and inference AI data operation performed by the AP 1800 and/or the accelerator chip 1820 using an arithmetic device provided in a memory controller 1610. The flash memory devices 1600*a* and 1600*b* may store photos captured through the camera 1100 or store data transmitted over a data network. For example, Augmented Reality/Virtual Reality, High Definition (HD), or Ultra High Definition (UHD) content may be stored.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A memory device comprising:

a memory core including a memory cell array including a plurality of memory cells, the memory cell array arranged into a plurality of memory banks;

a Built-In Self Test (BIST) circuit configured to select a target memory bank from the plurality of memory banks and perform a parallel test on the target memory bank among the plurality of memory banks; and a control circuit configured to control the parallel test, wherein the BIST circuit is configured to determine, in response to a one or more defective memory cells in the target memory bank outputting a defective bit among a plurality of target memory cells in the target memory bank, whether the defective memory cell is a single defective memory cell or an adjacent double defective memory cell, and wherein the control circuit is configured to determine the target memory bank to be a non-defective memory bank when the defective memory cell is the single defective memory cell or the adjacent double defective memory cell.

2. The memory device of claim 1, wherein the BIST circuit is configured to determine an output bit that is in a logical state different from an input bit, among output bits output from the plurality of target memory cells, as the defective bit.

3. The memory device of claim 2, wherein the BIST circuit comprises a first test circuit configured to determine the defective memory cell, a second test circuit configured to determine whether the defective memory cell is the single defective memory cell, and a third test circuit configured to determine whether the defective memory cell is the adjacent double defective memory cell.

4. The memory device of claim 3, wherein when one memory cell among the plurality of target memory cells outputs the defective bit, the second test circuit determines the one memory cell to be the single defective memory cell, and when a pair of memory cells adjacent to each other, among the plurality of target memory cells, output the defective bit, the third test circuit determines the pair of memory cells to be the adjacent double defective memory cell.

5. The memory device of claim 4, wherein each of the plurality of memory banks includes a plurality of word lines and a plurality of bit lines, and the plurality of memory cells are connected to the plurality of word lines and the plurality of bit lines, and the pair of memory cells are connected to one word line among the plurality of word lines and a pair of adjacent bit lines adjacent to each other among the plurality of bit lines.

6. The memory device of claim 5, wherein the pair of bit lines is determined by the control circuit.

7. The memory device of claim 6, wherein the third test circuit includes an input unit, a logic unit including a plurality of half adders, and an output unit for outputting an output signal, wherein the input unit is configured to receive a selection signal for determining the pair of bit lines from the control circuit and bit determination signals indicating whether each of the output bits is a defective bit from the first test circuit, and output the bit determination signals corresponding to the pair of memory cells, among the bit determination signals, to each of the plurality of half adders, the logic unit is configured to output a first internal signal to a third internal signal using the bit determination signals corresponding to the pair of memory cells, and the output unit configured to output an output signal indicating whether the pair of memory cells are the adjacent double defective memory cell using the first internal signal to the third internal signal.

8. The memory device of claim 7, wherein the input unit is configured to output a 2n-1th bit determination signal to an nth half adder and includes a plurality of multiplexers, and an nth multiplexer among the plurality of multiplexers is configured to output one of a 2n-2th bit determination signal and a 2nth bit determination signal to the nth half adder according to the selection signal.

9. The memory device of claim 8, wherein the nth multiplexer is configured to output the 2n-2th bit determination signal to the nth half adder when the selection signal is in a first state, and output the 2nth bit determination signal to the nth half adder when the selection signal is in a second state.

10. The memory device of claim 7, wherein the logic unit includes a first logic unit, a second logic unit, and a third logic unit, wherein the first logic unit includes the plurality of half adders, and each of the plurality of half adders is configured to perform a NAND logic operation and an XNOR logic operation on the bit determination signals corresponding to the pair of memory cells, the second logic unit includes a plurality of second logic circuits, and each of the second logic circuits is configured to perform a first NAND logic operation, a second NAND logic operation, and an XOR logical operation on outputs of a pair of half adders adjacent to each other, among the plurality of half adders, and the third logic unit includes at least one third logic circuit, and the third logic circuit is configured to perform a NAND logic operation, an AND logic operation, and a NOR logic operation on outputs of the second logic unit to output the first internal signal to the third internal signal.

11. The memory device of claim 10, wherein the first internal signal indicates whether, among first to fourth pairs of output bits output from first to fourth pairs of memory cells adjacent to each other among the plurality of target memory cells, the first pair of output bits are defective bits or the second to fourth pairs of output bits are defective bits.

12. The memory device of claim 10, wherein the second internal signal indicates whether among first to fourth pairs of output bits output from first to fourth pairs of memory cells adjacent to each other among the plurality of target memory cells, there are no defective bits, or a pair of output bits are defective bits, among the first and second pairs of output bits, and there are no defective bits, or a pair of output bits are defective bits, among the third and fourth pairs of output bits.

13. The memory device of claim 10, wherein the third internal signal indicates whether each of first to fourth pairs of output bits output from first to fourth pairs of memory cells adjacent to each other among the plurality of target memory cells is identical as a defective bit or a normal bit.

14. The memory device of claim 10, wherein the output unit is configured to output the output signal by performing an AND logical operation on the first internal signal to the third internal signal.

15. A memory device comprising:

a memory core including a memory cell array including a plurality of memory cells, the memory cell array being divided into a plurality of memory banks;

a Built-In Self Test (BIST) circuit configured to select a target memory bank from the plurality of memory banks and perform a parallel test on the target memory bank among the plurality of memory banks; and a control circuit configured to control the parallel test, wherein the BIST circuit includes, for target memory cells included in the target memory bank, a first test circuit configured to determine a defective memory cell and output a first output signal, a second test circuit configured to determine whether the defective memory cell is a single defective memory cell and output a second output signal, and a third test circuit configured to determine whether the defective memory cell is an adjacent double defective memory cell and output a third output signal, and wherein the control circuit is configured to determine the target memory bank to be a non-defective memory bank when the defective memory cell is the single defective memory cell or the adjacent double defective memory cell.

16. The memory device of claim 15, wherein the target memory cells are divided into a plurality of regions, and the BIST circuit is configured to output the first output signal to the third output signal for each of the plurality of regions.

17. The memory device of claim 16, wherein the first test circuit determines at least one memory cell outputting a logic state different from an input bit, among the target memory cells, as the defective memory cell, and outputs the first output signal in a second state with respect to a region including the defective memory cell, among the plurality of regions.

18. The memory device of claim 17, wherein when one memory cell among the target memory cells outputs the logic state different from the input bit, the second test circuit determines the one memory cell to be the single defective memory cell, and outputs the second output signal in a first state with respect to a region including the single defective memory cell among the plurality of regions, and when a pair of memory cells adjacent to each other among the target memory cells output the logic state different from the input bit, the third test circuit determines the pair of memory cells to be the adjacent double defective memory cell, and outputs the third output signal in a first state with respect to a region including the adjacent double defective memory cell among the plurality of regions.

19. The memory device of claim 18, wherein the control circuit determines the target memory bank to be a defective memory bank when the second output signal and the third output signal are not output in the first state, with respect to at least one region among the plurality of regions in which the first output signal is output in a second state.

20. A test method for a memory device including a plurality of memory banks, the method comprising:

selecting a target memory bank from the plurality of memory banks, and determining a defective memory cell outputting a logic state different from an input bit among target memory cells included in the target memory bank;

when the defective memory cell is determined among the target memory cells, determining whether the defective memory cell is a single defective memory cell or an adjacent double defective memory cell;

when the defective memory cell is the single defective memory cell or the adjacent double defective memory cell, determining the target memory bank to be a non-defective memory bank.

* * * * *